(12) United States Patent
Yea

(10) Patent No.: US 6,373,078 B1
(45) Date of Patent: Apr. 16, 2002

(54) MICROELECTRONIC RELAY WITH UPSET AND DOWNSET LEAD FRAMES

(75) Inventor: Sung Yea, La Canada, CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/407,456

(22) Filed: Sep. 28, 1999

(51) Int. Cl.⁷ .................. H01L 27/15; H01L 23/495
(52) U.S. Cl. ............... 257/81; 257/82; 257/100; 257/433; 257/676; 257/692
(58) Field of Search ............... 257/80, 81, 82, 257/83, 84, 99, 100, 433, 676, 692, 696

(56) References Cited

U.S. PATENT DOCUMENTS 5,647,034 A  * 7/1997 Matsuda et al. ............ 257/82

FOREIGN PATENT DOCUMENTS

JP        1-297866    * 11/1989
JP        5-136452    * 6/1993

* cited by examiner

Primary Examiner—Minh Loan Tran
(74) Attorney, Agent, or Firm—Ostrolenk, Faber, Gerb & Soffen, LLP

(57) ABSTRACT

A dual plane microelectronic relay comprises an input lead frame for carrying an LED an output lead frame carrying a PVG and FETs which are turned on by the output of the PVG in response to its illumination by the LED. Each lead frame is offset in opposite directions so that the lead frame segments carrying the LED and FETs are disposed atop one another while their extending contact pins are coplanar and in line. The PVG and LEDs along the lead frames are accurately located relative to one another by indexed tabs on the side rails of the lead frames. A clear silastic fills the volume between the PVG and LED and the individual units are transfer molded, using an opening in the lead frame rail as a mold gate. A 6 terminal SOP-6 package is formed.

17 Claims, 3 Drawing Sheets

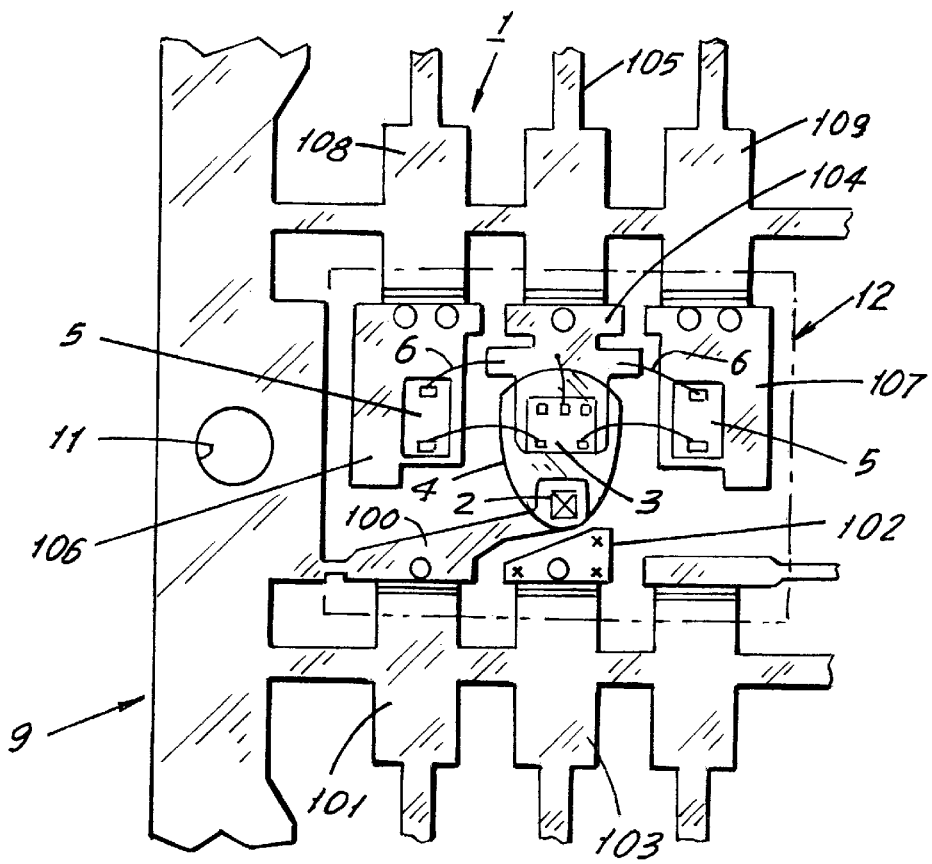
FIG. 1 _PRIOR ART_
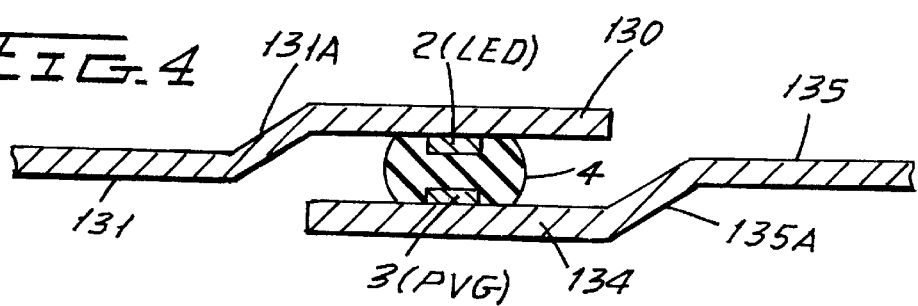
FIG. 4
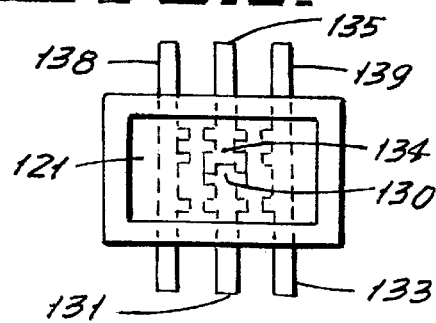
FIG. 5
FIG. 4A

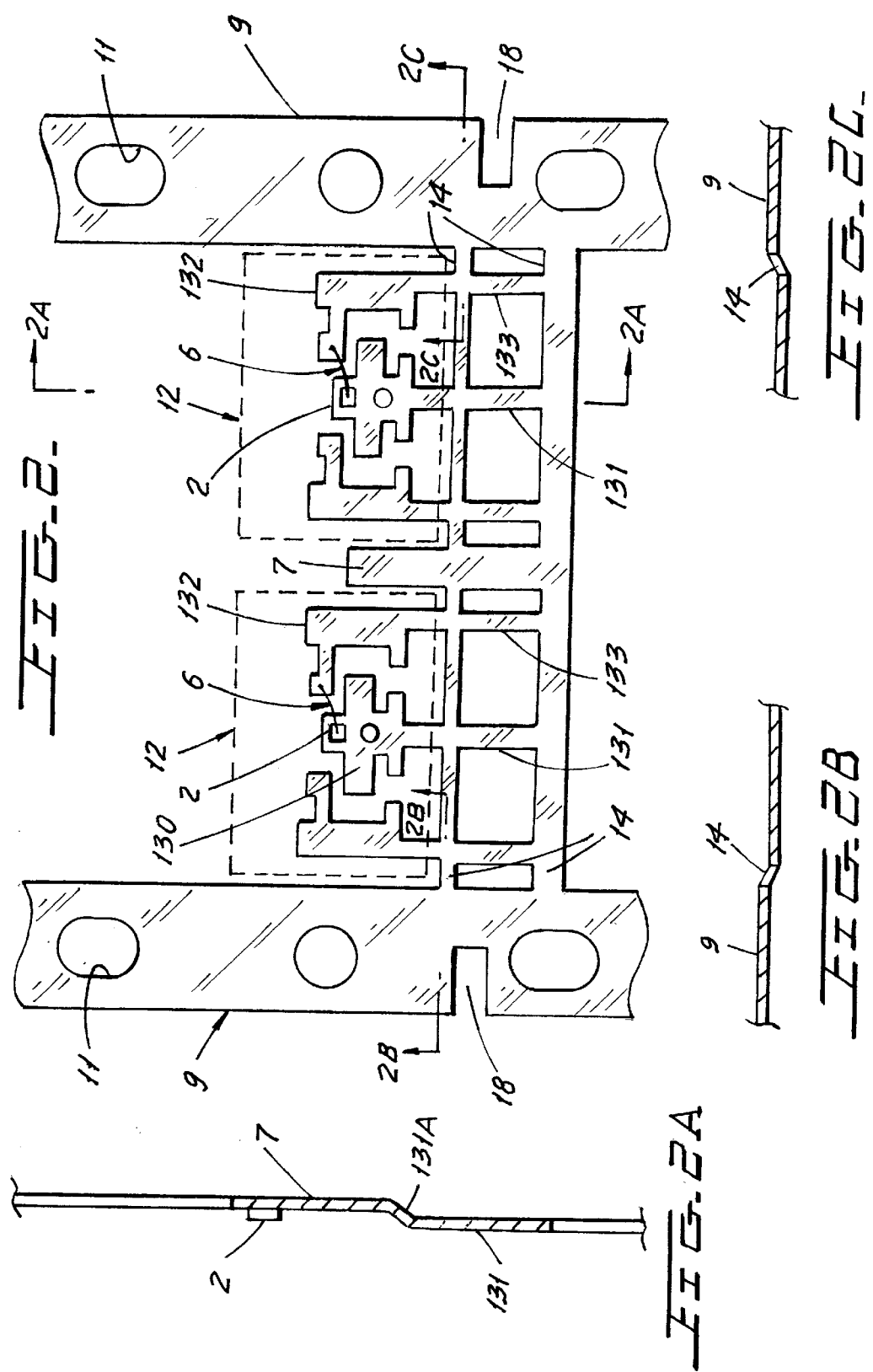

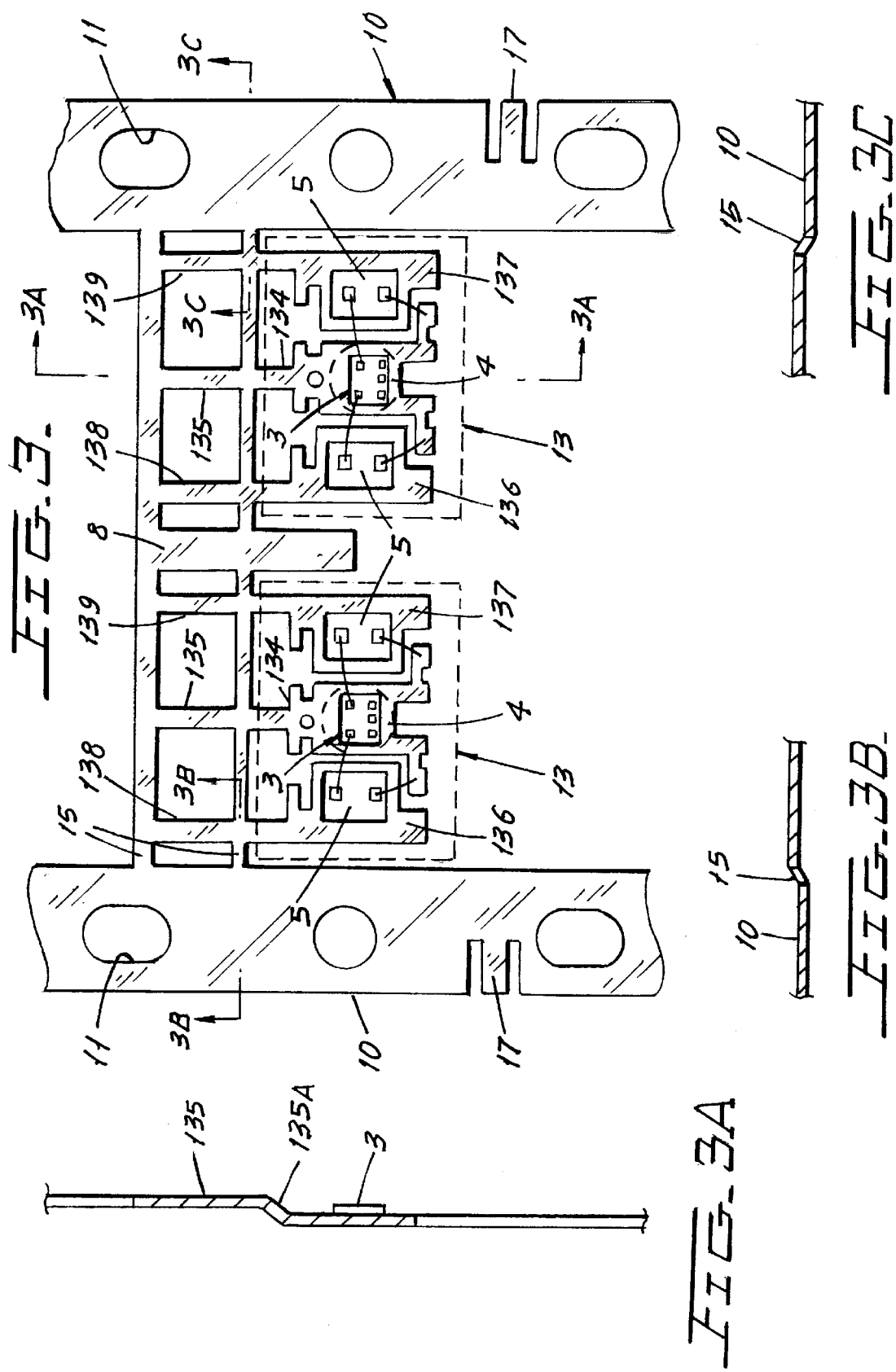

MICROELECTRONIC RELAY WITH UPSET AND DOWNSET LEAD FRAMES

FIELD OF THE INVENTION

The present invention relates to microelectronic relays, and more specifically relates to a novel miniaturized microelectronic relay which can be economically and reliably manufactured.

BACKGROUND OF THE INVENTION

Microelectronic relays are frequently contained within small outline packages (SOPs), such as those used in PCMCIA applications. Generally, such packages must be less than approximately 2 mm in thickness and must also meet certain regulatory safety standards. These safety requirements include maintenance of a dielectric isolation between the SOP's input and output pins, and a pin arrangement allowing for minimum creepage distance. In miniature SOPs (for example, a six pin SOP-6 package), meeting such requirements becomes an especially critical issue.

Generally, this type of microelectronic relay contains a light-emitting diode (LED) at its input, and a photovoltaic generator (PVG) and field-effect transistors (FETs) at its output. When the LED is energized, photons from the LED impinge on the PVG and the latter generates sufficient gate current to trigger the FET and turn the relay on. When the LED does not receive any illumination, the PVG does not generate any current, and the FET, and thus the relay, is switched off. Thus, the relay switches on and off while maintaining complete isolation between its input and output since the input and output are coupled only by the output light of the LED.

One known microelectronic relay consists of an LED at the input and a PVG and one or more FETs at the output in which all parts are on a common plane. An optically clear medium couples the LED and PVG to maintain input/output voltage and current isolation. A single leadframe serves as the sole plane upon which a plurality of sets of relay elements are positioned. The LED is optically coupled to its respective PVG by reflection from the boundary of the optically clear medium. The PVG and FETs are wirebonded before encapsulization to form the desired control and output electrical circuits, and the leadframe and bonded wiring is then over molded. The assembled leadframe is then singulated to form the individual SOP packages. These packages, however, must be large enough in area to accommodate the three lateral coplanar chips.

Another known relay packaging technique uses two lead frames in spaced parallel planes for the coupling between LED, PVG and FETs. An input LED lies on a top plane (top and bottom are arbitrarily selected) with the LED positioned upside down. The output PVG and FETs lie on a bottom plane, with both elements facing upwards and suitably connected together and to the leadframe. To manufacture these dual plane devices, the lead frames must be upset and downset respectively to a proper dimension to meet the required regulatory isolation between input and output terminals. This design is hard to manufacture due to the inherent difficulty in accurately aligning each of the LED and PVG sets within the two lead frames relative to one another and does not produce in-line output pins on opposite sides of the chip.

SUMMARY OF THE INVENTION

The microelectronic relay of the invention and its method of manufacture presents a solution to the problem of the simplified proper alignment of the LED with the PVG during the construction of a relay while maintaining a small area or "footprint" for the singulated devices and in-line output pins at opposite surfaces of the device housing. In the present invention, the microelectronic relay is manufactured using a combination of two interlocked lead frames: an input leadframe for the LED and an output leadframe for the PVG and FETs. Prior to the combination of the two lead frames, the LED is mounted on and connected to appropriate leads on the input leadframe, and the PVG and FETs are fixed to and connected to appropriate leads on the output leadframe. All relay elements are mounted and electrically connected to their respective leadframe with a curable conductive epoxy, or by soldering, or the like. Wirebonds provide the electrical connections to the respective leadframe elements.

Next, an optically clear elastomer is applied to the PVG elements on the lead frame. The application of the optically clear medium may be carried out by means of a syringe needle. After application to the PVG, the optically clear medium may be partially cured so as to prevent excessive flow.

The two lead frames are then combined with the assistance of integral locating pins on the two lead frames. The input leadframe is then held atop the output leadframe, with the LEDs upside down. The output leadframe is held with the PVGs and FETs facing upwards. Tabs in the output leadframe align with and fold into notches in the input leadframe in order to automatically position the two lead frames with respect to one another with precision. The lead frames are also bent in a novel manner such that, when the two lead frames are combined, the rails of the lead frames lie in a common plane. The entire combination of the interlocked lead frames, however, forms a dual plane relay, with the PVGs and LEDs precisely aligned and separated.

The combined lead frames are held together in this interlocked position for the remainder of the steps in the manufacturing process. The optically clear medium is next suitably completely cured, and a conventional transfer molding operation forms the main insulation packaging for each microelectronic relay section of the extending lead frames. The housings are then singulated, forming the individual small outline packages with small footprint and exactly spaced and aligned LED and PVG.

BRIEF DESCRIPTION OF THE DRAWINGS

FIG. 1 is a top view of a prior art microelectronic relay lead frame with the LED, PVG and FETs mounted in a lateral leadframe design.

FIG. 2 is a plan view of the input leadframe of the present invention, such input leadframe containing the LEDs of a plurality of packages to be singulated.

FIG. 2A is a cross-sectional view of FIG. 2 taken across section line A—A in FIG. 2.

FIG. 2B is a cross-section of FIG. 2, taken across section line B—B in FIG. 2.

FIG. 2C is a cross-section of FIG. 2, taken across section line C—C in FIG. 2.

FIG. 3 shows top and side views of the output leadframe of the present invention, such output leadframe containing a PVG and FETs.

FIG. 3A is a cross-sectional view of FIG. 3 taken across section line A—A in FIG. 3.

FIG. 3B is a cross-section of FIG. 3, taken across section line B—B in FIG. 3.

FIG. 3C is a cross-section of FIG. 3, taken across section line C—C in FIG. 3.

FIG. 4 is side view of the present invention showing the combined and interlocked lead frames of FIGS. 2 and 3, fixed in an exactly aligned and spaced relationship.

FIG. 4A shows one of the interlocks for locking the lead frames of FIGS. 2 and 3 together.

FIG. 5 is a top view of one of the singulated SOP packages of FIG. 4, with in line input and output pins.

DETAILED DESCRIPTION OF THE DRAWINGS

Reference numbers are assigned to elements in each of the figures of this specification to aid in the understanding of the present invention. Like reference numbers in multiple figures refer to the same element, regardless of where the element appears.

FIG. 1 is a top view of a prior art microelectronic relay leadframe 1 with a lateral design. Leadframe 1 serves as the sole leadframe for all relay elements. The leadframe 1 contains parallel side rails including side rail 9 which provides stability for the leadframe, and which contains apertures 11 to enable the leadframe to fit onto a conventional conveyer belt mechanism (not shown in the diagrams). The lead frame, will carry a plurality, for example, 20 identical device segments, which are simultaneously processed. Only one such segment is shown in FIG. 1.

The leadframe section shown in FIG. 1 is conventional and has a plurality of segments joined together for ease of assembly. Thus, one segment 100, severably joined to rail 9 and to pin 101 has one electrode of LED 2 electrically connected thereto; and has a second segment 102, connected to pin 103, which will be wirebonded to the top electrode of LED 2. A photovoltaic generator (PVG) 3 is mounted on segment 104 which is connected to pin 105. Two identical FETs 5 are mounted on segments 106 and 107 with their drain contacts connected to segments 106 and 107 (which are connected to pins 108 and 109 respectively) and their source contacts wire bonded to segment 104 and their gates are wirebonded to the output terminal of PVG 3. As usual, when the devices are singulated all leadframe bridging connections between all pins are severed.

LED 2 is then coupled to PVG 3 with an optically clear medium 4 such as a silastic. After the proper electrical connections are made, and the additional steps of molding and post-mold curing are applied to the relay elements, and the lateral leadframe is singulated to form one small outline package. Dashed lines 12 outlines the molded package after singulation.

FIGS. 2 through 5 show the present microelectronic relay of the present invention at its various stages of manufacture. Referring first to FIGS. 2 and 3, the input and output leadframes which are used in the assembly of the present invention are shown separately and prior to their combination. The drawings of these figures are shaded to indicate the precise shape of the two leadframes. Dashed lines 12 of input leadframe 7 and dashed lines 13 of output leadframe 8 indicate the extent of the final molded package after singulation of the leadframes.

FIGS. 2, 2A, 2B and 2C shows a top view and three cross-sectional views of input leadframe 7. FIGS. 3, 3A, 3B and 3C likewise shows the corresponding top view and cross-sectional views. The top views reveal the overall layout of the leadframes with the attached relay elements, while the sectional views demonstrate the manner in which the leadframes are bent. In a preferred embodiment, both input and output leadframes are about 0.2 mm thick and are fabricated from a standard copper-iron alloy through well-known assembly techniques.

As shown in FIGS. 2 and 3, input leadframe 7 and output leadframe 8 are each attached to two parallel side rails 9 and 10, at severable points 14 and 15, respectively. Side rails 9 and 10 provide longitudinal stability for the leadframes as they are guided into position during assembly of the relay. Side rails 9 and 10 further contain multiple apertures 11 which facilitate a fit onto the teeth of a conveyer belt or a similar feeding device. FIGS. 2 and 3 show a parallel pair of identical single segments of the leadframes. A plurality of identical segments, not shown, are repeated along the entire length of side rails 9 and 10.

In FIG. 2, dashed lines 12 outline the portion of input leadframe 7 on which the relay elements are mounted and which forms the top plane of the relay after encapsulation and singulation. Likewise, in FIG. 3, dashed lines 13 outline a similar portion of output leadframe 8, which forms the bottom plane of the singulated relay. As shown in FIG. 2A the portion of the input leadframe 7 enclosed within dashed lines 12 is bent downwards at a 45° angle relative to a plane coplanar with side rails 9. Similarly, as shown in FIG. 3A, the portion of output leadframe 8 enclosed within dashed lines 13 is bent downwards at a 45° angle relative to a plane coplanar with side rails 10. When the two leadframes are assembled to form the relay, input leadframe 7 is positioned upside down and output leadframe 8 is positioned right side up. When the leadframes are assembled in this manner, side rails 9 and 10 are coplanar while the top and bottom planes of the input and output frames lie in different spaced parallel planes. Accordingly, the input and output leads of the package will be directly in line.

In addition, as shown in FIGS. 2 and 3, each leadframe is downset and upset relative to side rails 9 and 10. Thus, as shown in FIGS. 2B and 2C, input leadframe 7 is downset at points 14 at a 45° angle, relative to a plane coplanar with side rail 9. As shown in FIG. 3B, output leadframe 8 is upset at points 15, at a 45° relative to a plane coplanar with side rail 10. Finally, pins 131 and 135 have offsets 131A and 135A as shown in FIGS. 2A and 3A respectively. The folding, downsetting and upsetting operations on the lead frame is easily performed using well-known stamping techniques.

In a preferred embodiment of the invention, the leadframes have a thickness of about 0.2 mm and are upset and downset by 0.1 mm respectively. A slot in one of the leadframe sides can act as a mold gate during the molding operation.

After the leadframes of FIGS. 2 and 3 are set in their proper positions, the relay elements are mounted on the leadframes and connected to one another and to the lead frames according to the required circuitry. As shown in FIG. 2, LED 2 is affixed to input leadframe 7. Likewise, in FIG. 3, PVG 3 and FETs 5 are placed on output leadframe 8. An optically clear silicone medium 4 is applied to the PVG 3 on output leadframe 8. LED 2, PVG 3 and FETs 5 are preferably attached to their respective leadframes using a conductive epoxy.

After mounting of the relay elements on their respective leadframes, PVG 3 and FETs 5 are connected by appropriate wirebond connections. Thus the bottom of LED 2 in FIG. 2 is bonded to lead frame segment 130 and ultimately to input pin 131. Its other electrode is wirebonded by wirebonds 6 to lead frame segment 132 and ultimately to input pin 133. PVG 3 in FIG. 3 is mounted on segment 134, which is ultimately connected to output pin 135. FETs 5 are mounted, at their drain contacts, to lead frame segments 136 and 137 and ultimately to output pins 138 and 139. Their sources are wirebonded to center segment 134 (and output pin 135); and their gates are wirebonded to suitable outputs of PVG 3.

The two leadframes are combined with the help of a novel locating pin arrangement. Thus, input leadframe 7, with LED 2, is first positioned upside down. The output leadframe 8, with PVG 3 and FETs 5, is positioned right side up. Proper alignment of the leadframes to position the LED 2 directly above the PVG 3 is achieved through a novel arrangement of tabs and notches present in the leadframes. Thus, a plurality of foldable tabs 17 are positioned along the length of side rails 10 of output leadframe 8 (FIG. 3). These tabs 17 are aligned with and folded across a plurality of notches 18, which are present along the length of side rails 9 of input leadframe 7 of FIG. 3. A more detailed view of the manner in which tabs 17 are folded across notches 18 is shown in FIG. 4A. Aside from allowing for the correct alignment of the relay elements, the folding of the tabs into the notches will also secure the two leadframes together for the remainder of the assembly process. The folding process may be carried out by stamping machines well-known in the art.

Once the two leadframes are interlocked, the remainder of the manufacturing steps may be carried out. The party cured optically clear medium is thus completely cured, and the relays are then encapsulated within an insulation housing by a conventional transfer molding operation or the like. Thus, the two halves of a molding die are enclosed over the interlocked leadframes. Plastic is then injected into the molding die, and is subsequently allowed to cure in order to form the insulation packaging. The molding die is removed and the plural packages are singulated to form the individual small outline packages. The singulation operation is performed by standard cutting machines well-known in the semiconductor manufacture art.

FIG. 4 is a cross-sectional view of one section of the lead frames 9 and 10, after the two leadframes are interlocked for one complete device. FIG. 4A is an enlarged view of the section of the assembled relay (referenced in the dashed circle) which demonstrates more precisely the manner in which the tabs 17 of output leadframe 8 are folded across the notches 18 of input leadframe 7. Referring to FIG. 4, LED 2 mounted on input leadframe 7 and PVG 3 fixed on output leadframe 8 are coupled with optically clear medium 4, and it is readily apparent that LED 2 lies directly above PVG 3.

Thus, in FIG. 4, the section shown is taken along pin 131 and lead frame segment 130 of the input lead frame of FIG. 2 and along pin 135 and segment 134 in FIG. 3. The novel interlock shown in FIG. 4A accurately fixes the input and output lead frames in exact relative lateral position to locate LED 2 precisely over PVG 3. The off-sets 14 and 15 and 131A and 135A fix the spacings of the surfaces of LED 2 and PVG 3. This space is enclosed by the clear silicone 4.

FIG. 5 shows a top view of the microelectronic relay device of the present invention in a standard integrated circuit six pin SOP-6 package, after the manufacturing steps of molding and singulation to remove all lead frame bridges which held the lead frame together during processing. Input leads 131, 133 and output leads 138, 135 and 139 protrude from the insulation housing 21 and are defined as the interlocked leadframes are singulated just beyond the molded package. The input and output leads are exactly in line as a result of off-sets 14 and 15 of FIGS. 2 and 3.

The final dimensions of the microelectronic relay may be controlled and varied according to the requirements of regulatory specifications. According to IEC950 requirements, the preferred thickness of the SOP-6 package is 2 mm. As shown in FIG. 4, the distance between the adjacent free surfaces of LED 2 and PVG 3 is 0.4 mm. Likewise, the distance between the bottom of the input plane and the top of output plane is 0.6 mm. Minimum creepage/clearance distance is also determined by package width and pin-to-pin pitch. As a result of manufacture according to the present method, the SOP-6 package can have a minimum 5 mm creepage distance, which meets the 4 mm criteria of IEC950.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A microelectronic relay comprising an input lead frame having a first lead frame segment and first contact pin extending from said first lead frame segment and an LED fixed to a first surface of said first lead frame segment; an output lead frame having a second lead frame segment and a second contact pin extending from said second lead frame segment and a photovoltaic generator (PVG) fixed to a first surface of said second lead frame segment; said first lead frame segment and said first contact pin being disposed in first and second spaced parallel planes respectively; said second lead frame segment and said second contact pin being disposed in third and forth spaced parallel planes that are parallel to said first and second planes; said first and second segments being disposed adjacent one another with said LED and photovoltaic generator (PVG) disposed atop one another but spaced from one another; said space between said first surfaces of said first and second segments being about 0.5 mm; said second and forth planes being coplanar; said first and second pins extending from their respective first and second lead frame segments in opposite longitudinal directions.

2. The device of claim 1, wherein said first and third planes and said second and fourth planes are spaced from one another by about ½ the thickness of their respective first and second contact pins.

3. The device of claim 2, wherein the volume between said LED and PVG is filled by a transparent insulation plastic.

4. The device of claim 3, which includes a plastic housing enclosing said first and second lead frame segments and a portion of said first and second contact pins; said first and second contact pins extending through opposite side walls respectively of said plastic housing and being in line with one another.

5. The device of claim 1, wherein the volume between said LED and PVG is filled by a transparent insulation plastic.

6. The device of claim 5, which includes a plastic housing enclosing said first and second lead frame segments and a portion of said first and second contact pins; said first and second contact pins extending through opposite side walls respectively of said plastic housing and being in line with one another.

7. The device of claim 5, further comprising a plurality of electrically isolated segments in said input and output lead frames;

ones of said plurality being coplanar with at least one of said first and second segments;

said plurality of segments being capable of receiving further electrical components; and each of said plurality of segments having respective contact pins extending therefrom that are parallel to and laterally spaced from said first and second contact pins.

8. The device of claim 1, which includes a plastic housing enclosing said first and second lead frame segments and a portion of said first and second contact pins; said first and second contact pins extending through opposite side walls respectively of said plastic housing and being in line with one another.

9. The device of claim 8, further comprising a plurality of electrically isolated segments in said input and output lead frames;
   ones of said plurality being coplanar with at least one of said first and second segments;
   said plurality of segments being capable of receiving further electrical components; and
   each of said plurality of segments having respective contact pins extending therefrom that are parallel to and laterally spaced from said first and second contact pins.

10. The device of claim 1, further comprising a plurality of electrically isolated segments in said input and output lead frames;
    ones of said plurality being coplanar with at least one of said first and second segments;
    said plurality of segments being capable of receiving further electrical components; and
    each of said plurality of segments having respective contact pins extending therefrom that are parallel to and laterally spaced from said first and second contact pins.

11. The device of claim 1, wherein the top surface of said LED and the top surface of said PVG are spaced by about 0.4 mm.

12. The device of claim 1, wherein said input and output lead frames contain respective pairs of side rails; said side rails containing interlock means for interlocking and locating said input and output lead frames relative to one another, thereby to precisely locate said LED and PVG in alignment with one another.

13. A microelectronic relay comprising an input lead frame having a first lead frame segment and first contact pin extending from said first lead frame section and an LED fixed to a first surface of said first lead frame segment; an output lead frame having a second lead frame segment and a second contact pin extending from said second lead frame segment and a PVG fixed to a first surface of said second lead frame segment; said first lead frame section and said first contact pin being disposed in first and second spaced parallel planes respectively; said second lead frame section and said second contact pin being disposed in third and forth spaced parallel planes which are parallel to said first and second planes; said first and second segments being disposed adjacent one another with said LED and PVG disposed atop one another but spaced from one another; said second and forth planes being coplanar; said first and third planes and said second and fourth planes are spaced from one another by about ½ the thickness of their respective first and second contact pins; said first and second pins extending from their respective first and second segments in opposite longitudinal directions.

14. The device of claim 13, wherein the volume between said LED and PVG is filled by a transparent insulation plastic.

15. The device of claim 14, which includes a plastic housing enclosing said first and second lead frame segments and a portion of said first and second contact pins; said first and second contact pins extending through opposite side walls respectively of said plastic housing and being in line with one another.

16. The device of claim 13, further comprising a plurality of electrically isolated segments in said input and output lead frames;
    ones of said plurality being coplanar with at least one of said first and second segments;
    said plurality of segments being capable of receiving further electrical components; and
    each of said plurality of segments having respective contact pins extending therefrom that are parallel to and laterally spaced from said first and second contact pins.

17. The device of claim 3, wherein the top surface of said LED and the top surface of said PVG are spaced by about 0.4 mm.

* * * * *